US000001990B1

(19) United States

(12) Statutory Invention Registration (10) Reg. No.: US H1990 H

Kherat et al. (43) Published: Sep. 4, 2001

(54) MAGNETIC SHUNT DEVICE FOR HALL EFFECT APPLICATIONS

(75) Inventors: Samir M. Kherat, Peoria; Stephen W. Rector, Metamora, both of IL (US)

(73) Assignee: Caterpillar Inc., Peoria, IL (US)

(21) Appl. No.: 09/220,239

(22) Filed: Dec. 23, 1998

(51) Int. Cl.[7] ..... H01L 43/00

(52) U.S. Cl. ..... 338/32 R

(58) Field of Search ..... 338/32 R, 32 H, 338/12; 324/207.25, 251, 252, 249, 207.21

(56) References Cited

U.S. PATENT DOCUMENTS

| | | | | |
|---|---|---|---|---|
| 3,471,844 | * | 10/1969 | Schugt | 340/196 |
| 3,787,769 | * | 1/1974 | Parkinson | 324/174 |
| 3,818,326 | * | 6/1974 | Masuda et al. | 324/34 PS |
| 4,124,814 | * | 11/1978 | Lauerman | 324/208 |

* cited by examiner

*Primary Examiner*—Daniel T. Pihulic

(74) *Attorney, Agent, or Firm*—Clifton Green

(57) ABSTRACT

A magnetic shunt device for use in a Hall effect sensor application wherein the shunt device is positioned and located relative to the Hall effect element and is shaped and dimensioned so as to shield and null the influence of the magnetic field when such field is substantially parallel to the sensitive plane of the Hall effect element. The present shunt device ensures that the null output voltage of the Hall effect element in a particular sensor application is consistent for a large number of such sensors despite misalignment problems and mechanical uncertainties in accurately arranging the magnetic devices that generate the magnetic field relative to the Hall effect element at the null or "no action" position of the sensor. The present device also obviates the requirement to use additional electronic circuitry to adjust the output voltage of the Hall effect element at the null or "no action" position.

15 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

MAGNETIC SHUNT DEVICE FOR HALL EFFECT APPLICATIONS

TECHNICAL FIELD

This invention relates generally to Hall effect devices and, more particularly, to Hall effect transducers and sensors having a magnetic shunt device associated therewith to null the magnetic field when the magnetic field is parallel to the sensitive face of the Hall effect device.

BACKGROUND ART

If exposed to a magnetic field, a current carrying Hall effect device typically produces an output voltage that is proportional to both the electric current and the sine of the angle between the magnetic field and the direction of the current flowing through the Hall effect device. That is, if there is no magnetic field, or if the magnetic field is parallel to the current direction flowing through the Hall effect device, in other words, the angle between the magnetic field and the current direction is zero, then the output voltage of the Hall effect device is either zero, or some null or quiescent output voltage. For a given electric current magnitude, the output voltage of the Hall effect device reaches its maximum value when the magnetic field is perpendicular (+90° and −90°) to the direction of the current.

In order to avoid reversal of the Hall effect output voltage as the magnetic field varies from −90° to +90° around the Hall effect device, linear Hall effect manufacturers bias the Hall effect output voltage such that minimum voltage is obtained when the magnetic field is at −90° and maximum voltage (V) is obtained when the magnetic field is at +90°. Therefore, in this arrangement, in the absence of the magnetic field, or if the magnetic field is parallel to the current direction, that is, the angle between the magnetic field and direction of current is zero, a linear Hall effect device should produce an output voltage at this null or "no action" position that is about half the voltage output (V/2) of the device.

In some linear Hall effect transducer applications, the Hall effect device output voltage is varied from its minimum value to its maximum value by rotating the magnetic field around the Hall effect device at a fixed, optimal distance. In this particular application, no magnetic field, or zero angle between the magnetic field and the direction of current of the Hall effect device, should produce the exact same output voltage. However, if the "at rest" position, or "no action" position, of the Hall effect device relative to the rotating magnetic field corresponds to the zero angle position therebetween, it may be difficult to mechanically center the magnetic field so that the angle between the magnetic field and the direction of current through the Hall effect device is precisely zero for every linear device produced. To attempt this mechanical centering procedure is both tedious and costly when a large number of linear Hall effect devices are to be produced. In order to circumvent this problem, potentiometers and other devices are traditionally added to the electronic circuitry associated with the Hall effect device to manually adjust the output voltage of such devices for the zero angle position.

It is, therefore, desirable to provide an easy way to null the affect of the magnetic field in a Hall effect sensor application when the magnetic field is parallel to the sensitive face of the Hall effect device.

It is also desirable to provide a Hall effect device that does not require additional electronic circuitry to adjust its output voltage at the zero angle or null position.

Still further, it is likewise desirable to ensure that the null output voltage of the Hall effect device in a particular application is consistent for a large number of such devices used in the same application despite mechanical uncertainties in accurately arranging the magnet(s) or electromagnet (s) and the Hall effect device at the zero angle or "no action" position.

Accordingly, the present invention is directed to overcoming one or more of the problems as set forth above.

DISCLOSURE OF THE INVENTION

In accordance with the teachings of the present invention, one embodiment of a Hall effect sensor is disclosed wherein a magnetic shunt device of appropriate size and dimension is positioned around a Hall effect device to null the magnetic field when this field is parallel to the sensitive plane of the Hall effect device. This shunt configuration ensures a consistent null output voltage for a large sample of similar devices despite mechanical positioning uncertainties and misalignment problems which arise during construction and manufacturing relative to the proper orientation of the magnetic devices that generate the magnetic field and the Hall effect device at the zero angle or "no action" position.

BRIEF DESCRIPTION OF THE DRAWINGS

For a better understanding of the present invention, reference may be made to the accompanying drawings in which.

BEST MODE FOR CARRYING OUT THE INVENTION

Figure 1:
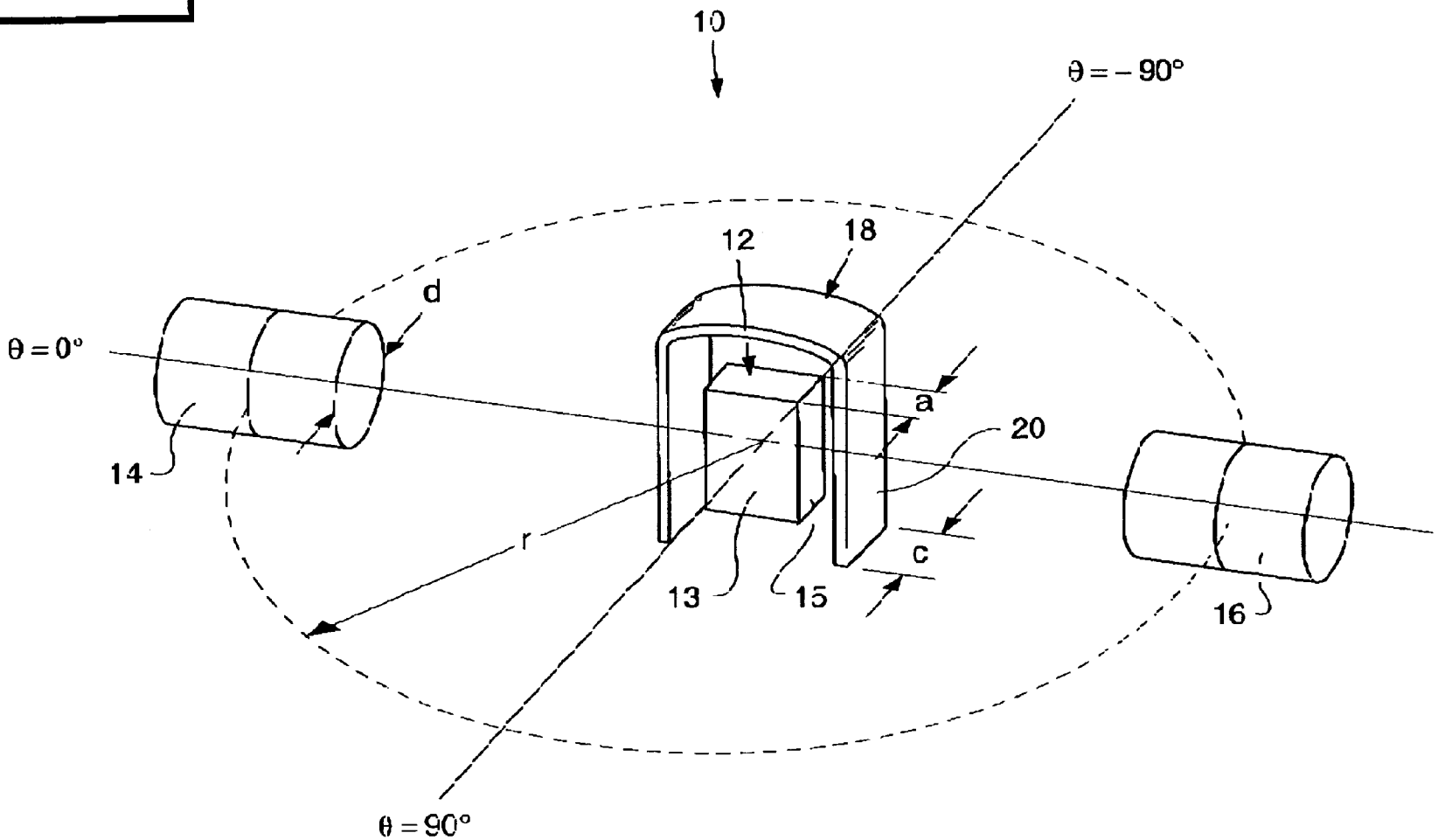
FIG. 1 is a partial perspective view of a Hall effect device used in a particular Hall effect sensor application wherein a shunt device constructed and positioned in accordance with the teachings of the present invention is utilized to null the magnetic field when the field is parallel to the sensitive plane of the Hall effect device.

Referring to FIG. 1, numeral 10 in FIG. 1 represents one embodiment of a Hall effect sensor application 10 that illustrates the principles of the present invention. The Hall effect sensor 10 may be of the type used to sense linear and rotary displacement and/or position in a wide variety of different environments and applications such as for use in work machines such as track type tractors, articulated trucks, integrated tool carriers, skid steer loaders, backhoe loaders, material handling machines, a wide variety of other mining and earthmoving type equipment, and a wide variety of automotive applications, and non-contact sensor/actuator applications.

The Hall effect sensor 10 illustrated in FIG. 1 includes a Hall effect element or transducer 12 which is mounted in a housing (not shown) such that two magnets 14 and 16 are positioned and located in opposed relationship to each other at a fixed, optimal radius "r" from the Hall effect element 12. Although cylindrical magnets 14 and 16 having a diameter "d" are illustrated in FIG. 1, it is recognized and anticipated that the magnets 14 and 16 can take on any shape and size and that such magnetic devices may be replaced with electromagnetic devices.

As illustrated in FIG. 1, the magnets 14 and 16 are positioned and located so as to be angularly rotatable about the element 12, each magnet 14 and 16 being rotatable approximately 180° as will be hereinafter explained. This rotation of the magnets can be accomplished by attaching the magnets to a rotating wheel, disk, or other rotatable device contained within the sensor housing. It is recognized and anticipated that other means for accomplishing this task can likewise be utilized.

As depicted in FIG. 1, the magnets 14 and 16 are positioned and located such that the angle θ=0°, the angle θ being the angle between the magnetic field generated by the magnets 14 and 16 and the sensitive plane 13 of the Hall effect element 12. In this regard, the sensitive plane 13 of Hall effect element 13 may include both the front and rear faces of the element 12. As positioned and located in FIG. 1, the Hall effect element 12 experiences no magnetic field when the magnets 14 and 16 are at the zero angle position (angle θ=0°) since the magnetic fields of the two respective magnets cancel each other out at this position. In this regard, it is important that the polarity of the respective magnets on each opposite side of the element 12 be opposite to each other so that the cancellation effect of the magnetic fields will occur. Also, at this particular magnetic orientation, that is, where the angle θ=0°, the magnetic field generated by each respective magnet 14 and 16 is parallel to the direction of current flowing through the Hall effect element 12.

Figure 2:
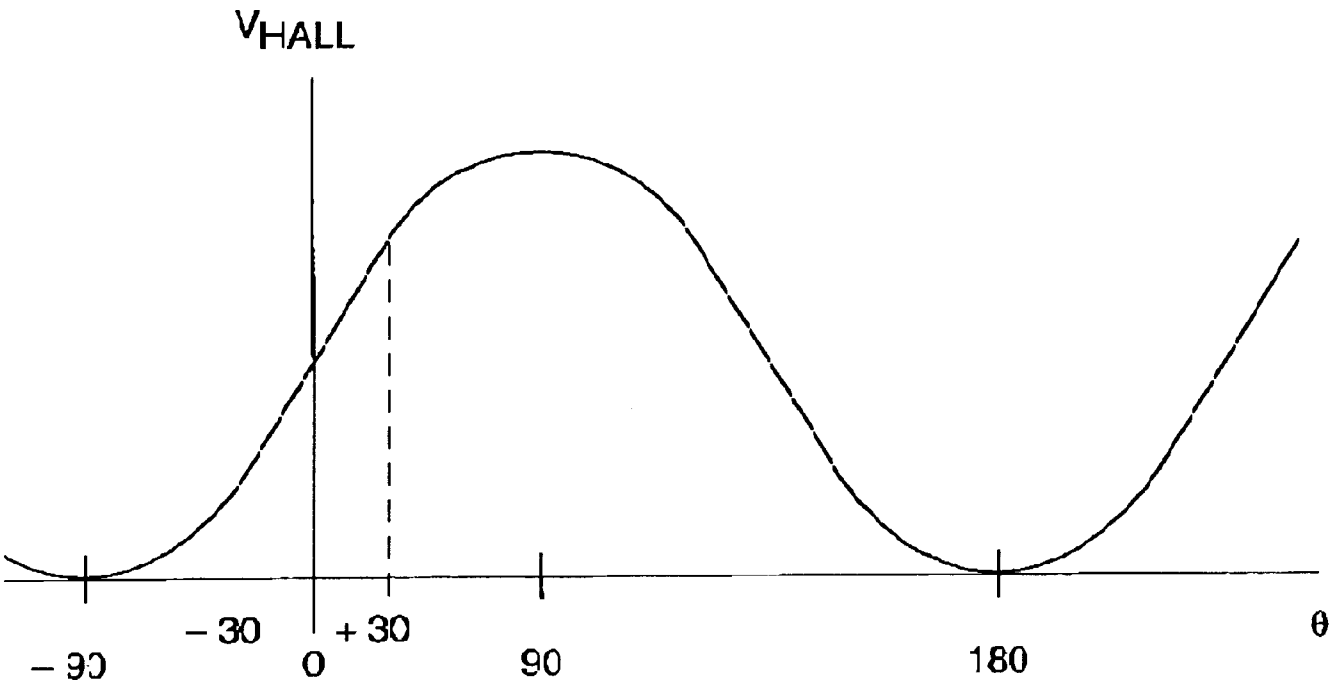
FIG. 2 is a diagram of the output voltage of a Hall effect device versus the magnetic field orientation (θ), that is, the angle between the magnetic field and the direction of current flowing through the Hall effect device.

As the orientation of the magnets 14 and 16 rotate around the Hall effect element 12 at the constant radius "r", a sinusoidal output voltage from the element 12 is obtained as best shown in FIG. 2. The output voltage of the Hall element 12 is biased by appropriate electronics such that minimum voltage is obtained when the magnetic field is at θ=−90° and maximum voltage is obtained when the magnetic field is at θ=+90°. Also, as can be easily seen from FIG. 2, the output voltage of the Hall effect element 12 at the orientation illustrated in FIG. 1, that is, where θ=0°, is approximately one-half of the output voltage (V/2) of the element 12. Depending upon the particular Hall effect device 12 being utilized, this output voltage is typically a low level signal on the order on 30 microvolts in the presence of a one gauss magnetic field. The bias associated with the Hall effect element 12 appears on the output voltage when no magnetic field is present (θ=0°) and is referred to as the null voltage. The Hall effect sensor 10 as illustrated in FIG. 1 therefore provides a voltage output that is proportional to the applied magnetic field and such sensor has a quiescent or zero angle output voltage that is approximately 50% of the supply voltage.

Since it is important that the null output voltage be the same for every Hall effect sensor 10 constructed, it is important that the mechanical orientation of the magnets or other magnetic devices 14 and 16 relative to the Hall effect element 12 at the angle θ=0° always be the same so that the same null voltage is obtained. Since it is difficult to manufacture a large number of sensors 10 that are always mechanically oriented and centered at the θ=0° position, some means must be provided to offset any voltage at this null position that may be due to misalignment in the positioning and orientation of the various magnetic devices 14 and 16 relative to the Hall effect element 12.

In accordance with the teachings of the present invention, a magnetic shunt device 18 is provided that shunts or shields the magnetic field generated by the magnets 14 and 16 from the Hall effect element 12 when the magnetic devices are located at the θ=0° position as illustrated in FIG. 1. The shunt device 18 can take on any particular shape or configuration, such as the U-shaped configuration illustrated in FIG. 1, so as to be compatible with the particular sensor configuration involved so long as the device 18 shields the sensitive plane 13 of the Hall effect element 12 from the magnetic field generated by the magnetic devices at the angle θ=0° position.

In the particular embodiment disclosed in FIG. 1, the magnetic shunt device 18 is positioned and located around the Hall effect element 12 such that the shunt side portions 20 are disposed in the path of the magnetic field when the magnets 14 and 16 are located at the θ=0° position to shield the sensitive plane 13 from the affects or influence of the magnetic field flux generated by the magnets 14 and 16 at the θ=0° position. In this regard, the width "c" of the respective shunt side portions 20 relative to the width "a" of the side portions 15 associated with the element 12 should be such that both the fore and aft faces of the sensitive plane 13 of the element 12 are shielded from the influence of the magnetic field at the θ=0° position, but that such sensitive faces are exposed to the affects or influence of the magnetic field at some angular displacement away from the angle θ=0°. The relationship between the width "c" of the shunt side portions 20 and the width "a" of the Hall effect element side portions 15 will determine at what angular orientation the sensitive plane 13 of the Hall effect element 12 will begin to be influenced by the magnetic field.

With the shunt device 18 positioned as illustrated in FIG. 1 around the Hall effect element 12, and with the magnets 14 and 16 positioned and located at the θ=0° angle, the null voltage output of the element 12 will remain consistent for any plurality of sensors 10 even if the alignment of the magnets 14 and 16 relative to the Hall effect element 12 at the θ=0° position varies from one sensor to another. The shunt device 18 can be constructed from any suitable magnetic material so long as the magnetic properties of such material are such that the magnetic field flex lines are either repulsed by or attracted to the shunt 18 and around the sensitive plane of the element 12.

As illustrated in FIG. 1, the diameter or width of the respective magnets 14 and 16 has been designated the dimension "d. Although the magnets 14 and 16 are shown as being cylindrical in shape, it is recognized and anticipated that such magnets could be square, rectangular or some other shape. With this in mind, the dimension "d" is intended to refer to the greatest width associated with the magnetic devices 14 and 16. Since, in general, the magnet width "d" is normally greater than the width "a" associated with the Hall effect element side portions 15, in order to null the magnetic field generated by the magnets 14 and 16 when such magnets are located at the position θ=0°, the width "c" of the shunt side portions 20 should be greater than the width "a" of the Hall effect element side portions 15. The amount by which the width "c" is greater than the width "a" will determine the angular displacement or orientation of the magnetic field relative to the sensitive plane 13 of the Hall effect element 12 whereby the element 12 will again be influenced by the magnetic field. In this regard, the width "c" should be no greater than the width or diameter "d" of the magnets 14 and 16 in order to avoid any degradation to the sensing capabilities of the element 12. As a result, the following relationships should exist between the widths "a" and "c" and the magnet width or radius "d":

"c">"a"

"c"<"d"

A good rule of thumb would be to use the equation $$\text{"c"}=0.9\times d.$$

Use of the magnetic shunt device 18 as illustrated in the embodiment disclosed in FIG. 1 would therefore ensure that any misalignment of the magnets 14 and 16 relative to the sensitive plane of the Hall effect element 12 at the θ=0° position will have no affect on the null output voltage of the element 12 at the "at rest" or "no action" position of the sensor 10, that is, at the θ=0° position.

INDUSTRIAL APPLICABILITY

As described herein, the present shunt device 18 has particular utility in a wide variety of different types of Hall effect sensor applications such as sensing linear or rotary position or displacement. Regardless of the particular application, use of the present shunt device 18 will ensure a consistent null output voltage from the Hall effect element despite mechanical uncertainties in the positioning and orientation of the magnetic devices relative to the Hall effect element at the "median" or "no action" position (θ=0°).

In the particular sensor embodiment illustrated in FIG. 1, as the magnets 14 and 16 are angularly rotated in opposed relationship to each other about the Hall effect element 12, the sinusoidal output voltage represented in FIG. 2 is typically obtained. It has been found that a deviation of less than 2% linearity is obtained when θ is limited to $-30° \leqq \theta \leqq +30°$. Although a linear output Hall effect element or transducer is considered to be linear over its span, in practice, no transducer is perfectly linear. The linearity associated with a particular Hall effect element or transducer such as 2% linearity typically defines the maximum error which results from assuming the transfer function is a straight line. For the particular sensor output voltage illustrated in FIG. 2, limiting θto the range $-30° \leqq \theta \leqq +30°$ is beneficial because the linearity of the output voltage over this range is quite good. For applications which require a pulse width modulation (PWM) output signal, the PWM output for this range of θ travel is also required. For a PWM output signal having a duty cycle range of 10% to 90%, typically the following correlation between the angle θ, the Hall effect element output voltage V and the outputted PWM signal duty cycle is as follows:

| Angle θ | Hall V(out) | PWM (out) |
|---|---|---|
| −90° | 0.5 V | — |
| −30° | 1.5 V | 10% |
| 0° | 2.5 V | 50% |
| +30° | 3.5 V | 90% |
| +90° | 4.5 V | — |

Figure 3:
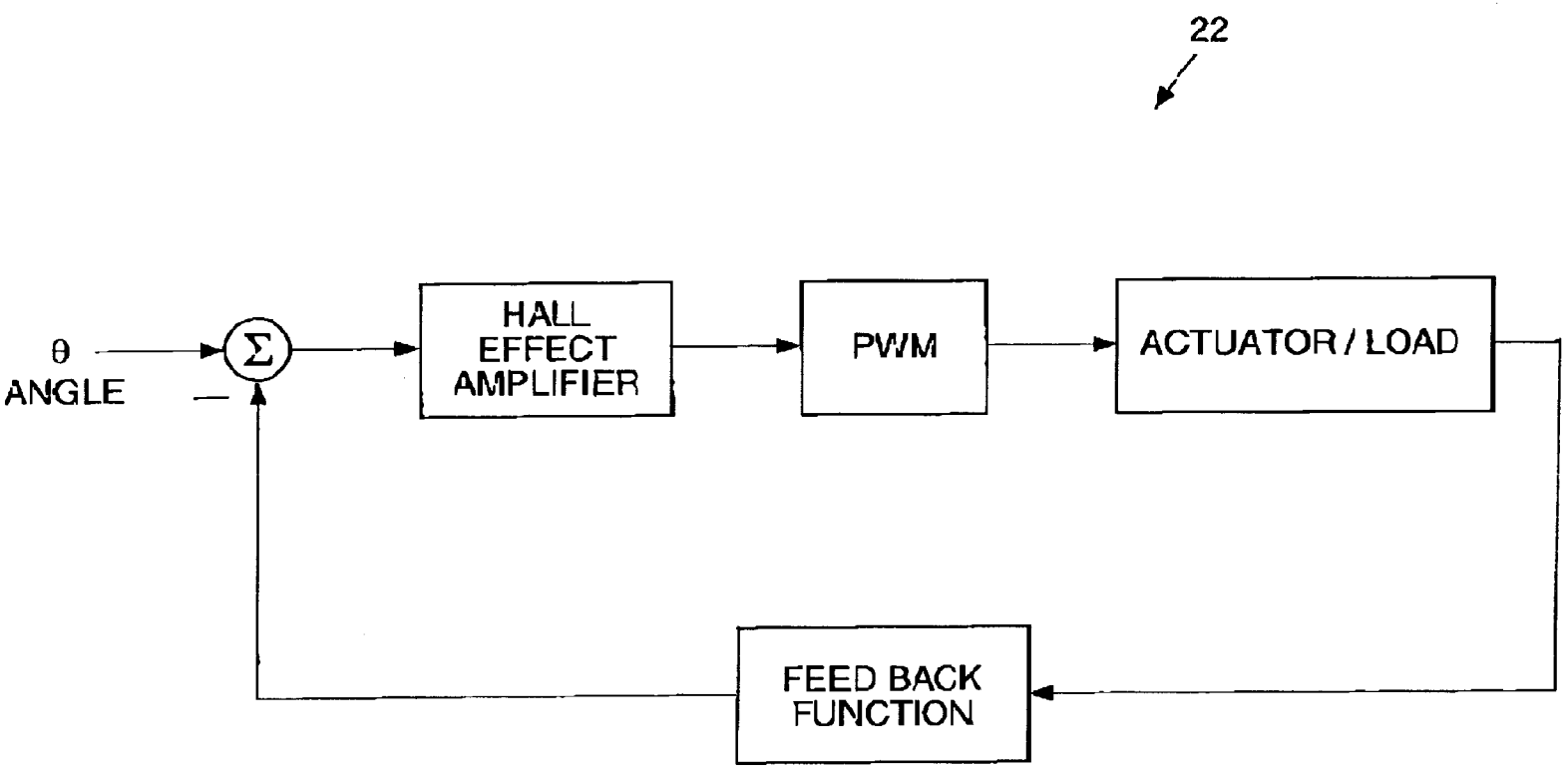
FIG. 3 is a schematic diagram showing one embodiment of a feedback control circuit for adjusting the output voltage of a Hall effect device to compensate for errors.

To limit the PWM signal to a 90% duty cycle for $\theta \geqq 30°$, a simple voltage divider may be used. On the other hand, when the magnet orientation angle θ is in the following range, $-30° < \theta < 0$ or $0 < \theta < 90°$ a feedback function such as the control circuit 22 illustrated in FIG. 3 is typically used to control the PWM output signal. For example, in an application where a Hall effect transducer is used to sense the position of an actuator or to sense a load, it is important to ensure that the PWM output signal is always at the 50% duty cycle when θ=0° for all Hall effect sensors produced for this particular application. Control circuitry may accomplish this adjustment by biasing the Hall effect output voltage to compensate for any offset.

With respect to the particular sensor application illustrated in FIG. 1, it is important that the null output voltage of the Hall effect element 12 remain constant for all sensors and that any misalignment of the magnets 14 and 16 relative to the element 12 at the angle θ=0° will not effect the null voltage of the element 12 at that position. With the two magnet arrangement illustrated in FIG. 1, it is important that the magnetic fields generated by such magnets cancel each other out so that the overall magnetic field at the sensitive plane 13 of the Hall effect element 12 is zero. In an application where only one magnet is utilized, the positioning and location of the magnet relative to the sensitive plane of the Hall effect element must be such that the magnetic field generated by such magnetic device is parallel to the current direction flowing through the Hall effect element at the angle θ=0° so that again such magnetic field has no effect or influence on the sensitive plane of the Hall effect element.

In order to avoid additional electronic circuitry to manually adjust or null the output voltage of the Hall effect element 12 at the zero angle position, the present magnetic shunt device 18, when properly positioned as illustrated in the embodiment set forth in FIG. 1, will shield and eliminate the affects of the magnetic field on the sensitive plane 13 of the Hall effect element 12 at the angle θ=0° to null out any output voltage that may be the result of misalignment of the magnetic devices relative to the Hall effect element 12.

Although there has been illustrated and described herein a specific embodiment of a Hall effect sensor application 10 incorporating the principles of the present invention as illustrated in FIG. 1, it is clearly understood that the sensor embodiment of FIG. 1 is merely for purposes of illustration only and that changes and modifications may be readily made to the shape and positioning of the magnetic shunt device 18 by those skilled in the art without departing from the spirit and scope of the present invention. Regardless of the application, the shape and dimensions of the magnetic shunt 18 should be such that the present device 18 shields and nulls the affects of the magnetic field at the sensitive plane of the Hall effect device when the angle between the magnetic field and the direction of current flow through the sensitive plane of the Hall effect device is substantially zero.

Other aspects, objects and advantages of the present invention can be obtained from a study of the drawings, the disclosure and the appended claims.

What is claimed is:

1. A shunt device for use in a Hall effect sensor having a Hall effect element and at least one magnetic device generating a magnetic field, the Hall effect element having a sensitive plane detecting the magnetic field generated by the at least one magnetic device, said shunt device being positioned and located adjacent to said Hall effect element and being shaped and dimensioned so as to shield the sensitive plane of the Hall effect element from the magnetic field generated by the at least one magnetic device when said magnetic field is parallel to the sensitive plane of said Hall effect element.

2. The shunt device, as set forth in claim 1, wherein the at least one magnetic device generating a magnetic field includes an electromagnetic device.

3. The shunt device, as set forth in claim 1, wherein the at least one magnetic device generating a magnetic field includes at least one magnet.

4. The shunt device, as set forth in claim 1, wherein the at least one magnetic device generating a magnetic field includes a pair of magnets positioned and located in opposed relationship to each other.

5. The shunt device, as set forth in claim 1, wherein the magnetic field generated by the at least one magnetic device is angularly rotatable about the sensitive plane of the Hall effect element between an angle of 0° wherein the magnetic field is parallel to the sensitive plane of the Hall effect element, and an angle of at least !90° wherein the magnetic field is perpendicular to the sensitive plane of the Hall effect element, said shunt device shielding the sensitive plane of the Hall effect element from the affects of the magnetic field when said magnetic field is located at the 0° angular orientation, and said shunt device exposing the sensitive plane of the Hall effect element to the affects of the magnetic field when said magnetic field is located at some angular orientation other than 0°.

6. The shunt device, as set forth in claim 5, wherein the magnetic field generated by the at least one magnetic device is further angularly rotatable about the sensitive plane of the Hall effect element between an angle of !90° wherein the magnetic field is perpendicular to the sensitive plane of the Hall effect element, and an angle of !180° wherein the magnetic field is again parallel to the sensitive plane of the Hall effect element, said shunt device shielding the sensitive plane of the Hall effect element from the affects of the magnetic field when said magnetic field is located at the !180° angular orientation, said shunt device exposing the sensitive plane of the Hall effect element to the affects of the magnetic field when said magnetic field is located at some angular orientation other than 0° and other than !180°.

7. The shunt device, as set forth in claim 5, wherein said shunt device nulls the magnetic field due to any misalignment of the Hall effect element and the at least one magnetic device at the 0° orientation.

8. The shunt device, as set forth in claim 5, wherein said shunt device nulls the magnetic field due to any misalignment of the Hall effect element and the at least one magnetic device at the ±180° orientation.

9. The shunt device, as set forth in claim 1, wherein at least the width of that portion of the shunt device positioned to shield the sensitive plane of the Hall effect element from the affects of the magnetic field when the magnetic field is parallel to said sensitive plane is greater than the width of the Hall effect element located adjacent thereto.

10. The shunt device, as set forth in claim 1, wherein at least the width of that portion of the shunt device positioned to shield the sensitive plane of the Hall effect element from the effects of the magnetic field when the magnetic field is parallel to said sensitive plane is less than or equal to the width of the at least one magnetic device.

11. The shunt device, as set forth in claim 1, wherein the width of said shunt device is greater than the width of the Hall effect element but less than the width of the at least one magnetic device.

12. The shunt device, as set forth in claim 1, wherein said shunt device is made of a magnetic material.

13. A magnetic shunt device for use in a Hall effect sensor wherein the Hall effect sensor includes a Hall effect element and a pair of magnetic devices, the magnetic devices being positioned in opposed relationship to each other and generating a magnetic field, the Hall effect element being positioned and located between the pair of opposed magnetic devices and having a sensitive plane which is affected by the magnetic field generated by said magnetic devices, said pair of magnetic devices being rotatable about the Hall effect element between a first position wherein the magnetic field generated by said magnetic devices is parallel to the sensitive plane of the Hall effect element, and a second position angularly related thereto, said shunt device being positioned and located so as to null the affect of the magnetic field on the sensitive plane of the Hall effect element when the magnetic devices are located at their first position, and said shunt device exposing the sensitive plane of the Hall effect element to the affects of the magnetic field when the magnetic devices are located at their second position.

14. A magnetic shunt device for use in a Hall effect sensor wherein the Hall effect sensor includes a Hall effect transducer and a pair of magnetic devices, said pair of magnetic devices being positioned in opposed relationship to each other and each generating a magnetic field, the Hall effect transducer being positioned and located between said opposed pair of magnetic devices and having a sensitive plane which is influenced by the magnetic field generated by said pair of magnetic devices, said pair of magnetic devices being rotatable about the Hall effect transducer in the range of $$-90\ °[\hbar[90°$$

where $\hbar$ is the angle between the magnetic field generate by said pair of magnetic devices and the direction of current flow through the Hall effect transducer, said magnetic shunt device shielding the sensitive plane of the Hall effect transducer from the influence of the magnetic field when $\hbar=0°$ and exposing the sensitive plane of the Hall effect transducer to the influence of the magnetic field when $$0 < \hbar[90° \text{ and when } -90°[\hbar < 0.$$

15. A magnetic shunt device for use in a Hall effect sensor wherein the Hall effect sensor includes a Hall effect transducer and a pair of magnetic devices, said pair of magnetic devices being positioned in opposed relationship to each other and each generating a magnetic field, the Hall effect transducer being positioned and located between said opposed pair of magnetic devices and having a sensitive plane which is influenced by the magnetic field generated by said pair of magnetic devices, said pair of magnetic devices being rotatable about the Hall effect transducer in the range of $$-180\ °[\hbar[180\ °0$$

where $\hbar$ is the angle between the magnetic field generate by said pair of magnetic devices and the direction of current flow through the Hall effect transducer, said magnetic shunt device shielding the sensitive plane of the Hall effect transducer from the influences of the magnetic field when $\hbar=0°$ and when $\hbar=!180°$, and said magnetic shunt device exposing the sensitive plane of the Hall effect transducer to the influence of the magnetic field when $$0<\hbar[180° \text{ and when} -180°[\hbar<0.$$

* * * * *